(12) United States Patent
Palaniappa et al.

(10) Patent No.: US 9,048,565 B2
(45) Date of Patent: Jun. 2, 2015

(54) ADAPTER APPARATUS WITH DEFLECTABLE ELEMENT SOCKET CONTACTS

(71) Applicant: Ironwood Electronics, Inc., Eagan, MN (US)

(72) Inventors: Ilavarasan M. Palaniappa, Rosemount, MN (US); Vinayak Reddy Panavala, Shakopee, MN (US); Mickiel P. Fedde, Eagan, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 13/916,025

(22) Filed: Jun. 12, 2013

(65) Prior Publication Data

US 2014/0370725 A1    Dec. 18, 2014

(51) Int. Cl.
| | |
|---|---|
| *H01R 12/57* | (2011.01) |
| *H01R 43/26* | (2006.01) |
| *H01R 12/71* | (2011.01) |
| *H01R 43/20* | (2006.01) |
| *H05K 3/30* | (2006.01) |
| *H05K 7/10* | (2006.01) |

(52) U.S. Cl.
CPC ............. *H01R 12/57* (2013.01); *H01R 43/26* (2013.01); *Y10T 29/49208* (2015.01); *H01R 12/716* (2013.01); *H01R 43/205* (2013.01); *H05K 3/30* (2013.01); *H05K 7/10* (2013.01)

(58) Field of Classification Search
CPC .... H01R 12/523; H01R 12/58; H01R 13/111; H01R 13/6315; H01R 4/027; H01R 2103/00; H01R 24/05; H01R 12/724; H01R 13/113; H01R 13/187; H01R 13/516; H01R 13/6608; H01R 13/7197; H01R 31/06
USPC .................................................... 439/882, 81
See application file for complete search history.

(56) References Cited

U.S. PATENT DOCUMENTS

| | | |
|---|---|---|
| 2,578,288 A | 12/1951 | Cook |
| 2,951,817 A | 9/1960 | Myers |
| 3,229,756 A | 1/1966 | Keresztury |
| 3,728,509 A | 4/1973 | Shimojo |
| 3,760,342 A | 9/1973 | Prouty et al. |

(Continued)

FOREIGN PATENT DOCUMENTS

| | | |
|---|---|---|
| EP | 0 905 826 A2 | 3/1999 |
| WO | WO 97/16849 | 5/1997 |
| WO | WO 99/66599 | 12/1999 |

OTHER PUBLICATIONS

Application Notes for Surface Mount Assembly of Amkor's *Micro*LeadFrame(MLF) Packages. Sep. 2002.

(Continued)

*Primary Examiner* — Briggitte R Hammond
(74) *Attorney, Agent, or Firm* — Mueting, Raasch & Gebhardt, P.A.

(57) ABSTRACT

An adapter apparatus includes a substrate having a plurality of openings defined therethrough. Further, a deflectable element socket contact is provided in each of the openings. When a conductive male pin is positioned in contact between first and second deflectable elements of the deflectable element socket contact, at least a portion of the first and second deflectable elements are caused to deflect within first and second deflection regions, respectively, of the defined opening.

20 Claims, 12 Drawing Sheets

(56) References Cited

U.S. PATENT DOCUMENTS

| | | | |
|---|---|---|---|
| 3,870,385 A | 3/1975 | Avakian et al. | |
| 3,971,610 A | 7/1976 | Buchoff et al. | |
| 4,295,699 A | 10/1981 | DuRocher | |
| 4,345,810 A | 8/1982 | Bakermans | |
| 4,460,223 A | 7/1984 | Brown et al. | |
| 4,514,784 A | 4/1985 | Williams et al. | |
| 4,519,660 A * | 5/1985 | Ichimura et al. | 439/296 |
| 4,550,959 A * | 11/1985 | Grabbe et al. | 439/33 |
| 4,655,524 A | 4/1987 | Etzel | |
| 4,668,957 A | 5/1987 | Spohr | |
| 4,678,250 A | 7/1987 | Romine et al. | |
| 4,729,166 A | 3/1988 | Lee et al. | |
| 4,754,546 A | 7/1988 | Lee et al. | |
| 4,762,498 A | 8/1988 | Harting et al. | |
| 4,862,076 A | 8/1989 | Renner et al. | |
| 4,875,863 A * | 10/1989 | Reed | 439/81 |
| 4,878,861 A | 11/1989 | Kendall et al. | |
| 4,923,739 A | 5/1990 | Jin et al. | |
| 5,037,314 A * | 8/1991 | Bricaud et al. | 439/81 |
| 5,074,799 A | 12/1991 | Rowlette, Sr. | |
| 5,092,783 A * | 3/1992 | Suarez et al. | 439/81 |
| 5,109,320 A | 4/1992 | Bourdelaise et al. | |
| 5,123,849 A | 6/1992 | Deak et al. | |
| 5,127,837 A | 7/1992 | Shah et al. | |
| 5,129,833 A | 7/1992 | Rowlette, Sr. | |
| 5,137,462 A | 8/1992 | Casey et al. | |
| 5,140,405 A | 8/1992 | King et al. | |
| 5,155,661 A | 10/1992 | Nagesh et al. | |
| 5,163,837 A | 11/1992 | Rowlette, Sr. | |
| 5,286,218 A | 2/1994 | Sakurai et al. | |
| 5,313,099 A | 5/1994 | Tata et al. | |
| 5,318,456 A | 6/1994 | Mori | |
| 5,340,318 A | 8/1994 | Kunihiro | |
| 5,376,026 A * | 12/1994 | Ohashi | 439/83 |
| 5,377,900 A | 1/1995 | Bergmann | |
| 5,387,861 A | 2/1995 | Neiderhofer | |
| 5,389,819 A | 2/1995 | Matsuoka | |
| 5,397,240 A | 3/1995 | Herard | |
| 5,397,245 A | 3/1995 | Roebuck et al. | |
| 5,397,919 A | 3/1995 | Tata et al. | |
| 5,418,471 A | 5/1995 | Kardos | |
| 5,432,679 A | 7/1995 | Grabbe | |
| 5,445,526 A | 8/1995 | Hoshino et al. | |
| 5,468,158 A | 11/1995 | Roebuck et al. | |
| 5,473,510 A | 12/1995 | Dozier, II | |
| 5,477,160 A | 12/1995 | Love | |
| 5,528,462 A | 6/1996 | Pendse | |
| 5,548,223 A | 8/1996 | Cole et al. | |
| 5,566,052 A | 10/1996 | Hughes | |
| 5,636,996 A | 6/1997 | Johnson et al. | |
| 5,662,163 A | 9/1997 | Mira | |
| 5,667,870 A | 9/1997 | McCullough | |
| 5,691,041 A | 11/1997 | Frankeny et al. | |
| 5,699,227 A | 12/1997 | Kolman et al. | |
| 5,710,459 A | 1/1998 | Teng et al. | |
| 5,712,768 A | 1/1998 | Werther | |
| 5,725,393 A * | 3/1998 | Steininger et al. | 439/597 |
| 5,730,608 A * | 3/1998 | Legrady | 439/78 |
| 5,730,620 A | 3/1998 | Chan et al. | |
| 5,735,698 A | 4/1998 | Bakker et al. | |
| 5,741,141 A | 4/1998 | O'Malley | |
| 5,742,481 A | 4/1998 | Murphy et al. | |
| 5,745,346 A | 4/1998 | Ogawa et al. | |
| 5,761,050 A | 6/1998 | Archer | |
| 5,766,022 A | 6/1998 | Chapin et al. | |
| 5,770,891 A | 6/1998 | Frankeny et al. | |
| 5,783,461 A | 7/1998 | Hembree | |
| 5,791,914 A | 8/1998 | Loranger et al. | |
| 5,793,618 A | 8/1998 | Chan et al. | |
| 5,805,424 A | 9/1998 | Purinton | |
| 5,810,607 A | 9/1998 | Shih et al. | |
| 5,819,406 A | 10/1998 | Yoshizawa et al. | |
| 5,829,988 A | 11/1998 | McMillan et al. | |
| 5,833,471 A | 11/1998 | Selna | |
| 5,859,538 A | 1/1999 | Self | |
| 5,876,219 A | 3/1999 | Taylor et al. | |
| 5,877,554 A | 3/1999 | Murphy | |
| 5,879,172 A | 3/1999 | McKenna-Olson et al. | |
| 5,892,245 A | 4/1999 | Hilton | |
| 5,893,765 A | 4/1999 | Farnworth | |
| 5,896,037 A | 4/1999 | Kudla et al. | |
| 5,923,176 A | 7/1999 | Porter et al. | |
| 5,973,618 A | 10/1999 | Ellis | |
| 5,982,635 A | 11/1999 | Menzies et al. | |
| 6,007,348 A | 12/1999 | Murphy | |
| 6,196,886 B1 * | 3/2001 | Sato | 439/885 |
| 6,264,490 B1 * | 7/2001 | Lemke et al. | 439/342 |
| 6,325,280 B1 | 12/2001 | Murphy | |
| 6,351,392 B1 | 2/2002 | Palaniappa et al. | |
| 6,394,820 B1 | 5/2002 | Palaniappa et al. | |
| 6,533,589 B1 | 3/2003 | Palaniappa et al. | |
| 6,623,280 B2 | 9/2003 | Oldenburg et al. | |
| 6,644,981 B2 | 11/2003 | Choy | |
| 6,877,993 B2 | 4/2005 | Palaniappa et al. | |
| 7,083,434 B1 | 8/2006 | Blossfeld | |
| 7,368,814 B1 | 5/2008 | Tully et al. | |
| 7,874,880 B2 | 1/2011 | Fedde et al. | |
| 8,091,222 B2 | 1/2012 | Fedde et al. | |
| 8,167,630 B2 * | 5/2012 | Lemke et al. | 439/83 |
| 2005/0221690 A1 * | 10/2005 | Suzuki et al. | 439/843 |
| 2009/0197479 A1 * | 8/2009 | Glick et al. | 439/752 |

OTHER PUBLICATIONS

Ironwood Electronics, Inc. VLSI Interconnection Specialists Catalog XII (pp. 84, 110) (product on p. 110 available at least as early as Oct. 4, 1998).

Ironwood Electronics, Inc. VLI Interconnection Specialists Product Brochure, Spring 1998. 6 pages.

Herard et al., "Interconnection Technology: Using dendrites to bridge the gaps," *Printed Circuit Fabrication*, 1995;18(9):22-24.

Jarvela R.A., "Module Holder and Actuator," *Technical Disclosure Bulletin*, 1974;16(12):3975-3976.

Lau, John H. ed., "A brief introduction to Ball Grid Array Technologies," *ball Grid Array Technology*, 1995;pp. xii-i-xvi:1-57. 4849-4382-0822, v. 1.

* cited by examiner

ADAPTER APPARATUS WITH DEFLECTABLE ELEMENT SOCKET CONTACTS

BACKGROUND

The present invention relates generally to adapters for use with packaged devices or other adapter apparatus (e.g., male pin adapters).

Certain types of integrated circuit packages are becoming increasingly popular due to their occupancy area efficiency. In other words, they occupy less area on a target board on which they are mounted while providing a high density of contact terminals. For example, such high density package types may include a ball grid array, land grid array package, chip scale package, or wafer level package.

Generally, for example, ball grid array packages contain an integrated circuit having its die bond pads electrically connected to respective conductive solder spheres that are distributed on the bottom surface of the package in an array. A target printed circuit board typically has formed on its surface a corresponding array of conductive pads which align with the array of solder spheres for electrically mounting the ball grid array package on the target board.

The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging (e.g., ball grid array packages) provide a high density of terminals at a very low cost. Also, this packaging provides for limited lead lengths. Limited lead lengths may reduce the risk of damage to such leads of the package, may provide for higher speed product, etc.

Circuit boards and/or components mounted thereon may be tested by designers as the circuit boards are being developed. For example, for a designer to test a circuit board and/or a ball grid array package mounted thereon, the designer must first electrically connect the solder spheres on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with packages soldered thereon.

Various adapters which have been described for electrically connecting high density packaged devices to a target printed circuit board are known. Various intercoupling components are used to provide such adapters. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal" describe several adapter apparatus for use in mounting ball grid array packages, as well as intercoupling components of other conventional adapter devices; in many instances such adapters have terminals (e.g., female socket pins) configured for receiving a mating terminal (e.g., female socket pins configured to receive male pins). For example, such female socket pins may be press-fit into openings formed in an insulative material so as to provide a contact for receiving a male pin. Further, for example, U.S. Pat. No. 7,874,880 to Fedde et al., issued 25 Jan. 2011, entitled "Adapter Apparatus with Sleeve Spring Contacts," describes yet other alternative adapter apparatus for use in mounting ball grid array packages, as well as intercoupling components of other conventional adapter devices, such as for receiving a mating terminal (e.g., to receive male pins).

Conventional female pin contacts are generally constructed with use of a stamped clip which is formed in a circle with separate fingers which are pushed aside when a male pin is inserted. For example, such a clip is generally manufactured using a stamping or rolling process (e.g., with a material such as berylium copper alloy).

However, such clip manufacturing can be prohibitively costly due to the necessary tooling required when the sockets in which the female socket pins are used have a very small pitch (e.g., in the 0.5 millimeter range). Further, the tooling to form such female clips can be difficult to miniaturize because of the inherent inaccuracies of stamping very small parts.

SUMMARY

The disclosure herein relates generally to adapter apparatus that use deflectable element socket contacts to provide a female socket into which a male pin may be inserted. For example, such deflectable element socket contacts may overcome the manufacturing problems of other types of female contacts.

One exemplary adapter apparatus described herein may include a substrate (e.g., having a pin receiving side and a connection side opposite the pin receiving side) with a plurality of openings being defined through the substrate between the pin receiving side and the connection side. Each opening of the plurality of openings may include a center pin receiving region and first and second deflection regions (e.g., each of the first and second deflection regions may be defined by one or more deflection region surfaces opposite the other and adjacent the center pin receiving region). The adapter apparatus may further include a plurality of deflectable element socket contacts (e.g., each of the plurality of deflectable element socket contacts may be provided within a corresponding opening of the plurality of openings). Each of the plurality of deflectable element socket contacts may include an end connection portion and first and second deflectable elements (e.g., the first deflectable element may be coupled to the end connection portion and provided at least partially in the first deflection region with a portion thereof in contact with at least a portion of the one or more deflection region surfaces defining the first deflection region and the second deflectable element may be coupled to the end connection portion and provided at least partially in the second deflection region with a portion thereof in contact with at least a portion of the one or more deflection region surfaces defining the second deflection region). The first and second deflectable elements may be configured to deflect within the first and second deflection regions, respectively, when a male pin is received in the pin receiving region and in contact between the first and second deflectable elements.

One or more embodiments of the adapter apparatus may include one or more of the following features: the deflectable element socket contacts may be flat; the first and second deflectable elements may be symmetrical about an axis extending through the corresponding opening and spaced apart to receive a male pin therebetween; the first and second deflectable elements may be spaced apart by a greater distance towards the connection side of the substrate than towards the pin receiving side of the substrate; the first and second deflectable elements may be spaced apart by a distance that is less than the diameter of a male pin to be received thereby towards the pin receiving side of the substrate; each of the first and second deflectable elements may include an elongate portion (e.g., the elongate portion of the first deflectable element may extend from a first end region located within the first deflection region and coupled to the end connection portion to a second end region located at least in part within the pin receiving region, and further, the elongate portion of the second deflectable element may extend from a first end region located within the second deflection region and coupled to the end connection portion to a second end region located at least in part within the pin receiving region); each of the elongate portions of the first and second deflectable elements may be coupled to the end connection portion by a transition portion with the end connection portion being centered at the connection side of the substrate relative to the pin receiving region; the end connection portion may extend beyond the connection side of the substrate; a fill material may be provided between the end connection portions of the plurality of deflectable element socket contacts adjacent the connection side of the substrate; each of the elongate portions of the first and second deflectable elements may be coupled to the connection end by a transition portion (e.g., each of the transition portions may include a contact surface in contact with at least a portion of the one or more deflection region surfaces defining the first and second deflection regions, respectively); a length of each of the first and second deflectable elements may be at least twice the width of the deflectable element socket contacts from the contact surface on the first deflectable element to the contact surface on the second deflectable element; each of the first and second deflectable elements may terminate towards the pin receiving side of the substrate at a chamfered region to center a male pin when inserted into the pin receiving region of the opening; the center pin receiving region may include a center cylindrical region having a diameter that is greater than the diameter of a male pin to be received therein; and each of the first and second deflection regions may include a cylindrical region having a diameter that is less than the diameter of the center cylindrical region.

One exemplary embodiment of a method for use in forming an adapter apparatus may include providing a substrate having a pin receiving side and a connection side opposite the pin receiving side with a plurality of openings being defined through the substrate between the pin receiving side and the connection side. Each opening of the plurality of openings may include a center pin receiving region and first and second deflection regions (e.g., each of the first and second deflection regions may be defined by one or more deflection region surfaces opposite the other and adjacent the center pin receiving region). The method may further include inserting a deflectable element socket contact into each of the plurality of openings. For example, the deflectable element socket contact may include an end connection portion and first and second deflectable elements (e.g., the first deflectable element may be coupled to the end connection portion and provided at least partially in the first deflection region with a portion thereof in contact with at least a portion of the one or more deflection region surfaces defining the first deflection region and the second deflectable element may be coupled to the end connection portion and provided at least partially in the second deflection region with a portion thereof in contact with at least a portion of the one or more deflection region surfaces defining the second deflection region). A conductive male pin may be positioned in contact between the first and second deflectable elements causing at least a portion of the first and second deflectable elements to deflect within the first and second deflection regions, respectively.

One or more embodiments of the method may include one or more of the following features, processes or steps: the deflectable element socket contacts may be flat; the first and second deflectable elements may be symmetrical about an axis extending through the corresponding opening and spaced apart to receive a male pin therebetween; the first and second deflectable elements may be spaced apart by a greater distance towards the connection side of the substrate than towards the pin receiving side of the substrate; the first and second deflectable elements may be spaced apart by a distance that is less than the diameter of a male pin to be received thereby towards the pin receiving side of the substrate; each of the first and second deflectable elements may include an elongate portion (e.g., the elongate portion of the first deflectable element may extend from a first end region located within the first deflection region and coupled to the end connection portion to a second end region located at least in part within the pin receiving region, and the elongate portion of the second deflectable element may extend from a first end region located within the second deflection region and coupled to the end connection portion to a second end region located at least in part within the pin receiving region); each of the elongate portions of the first and second deflectable elements may be coupled to the end connection portion by a transition portion with the end connection portion being centered at the connection side of the substrate relative to the pin receiving region; the end connection portions of the plurality of deflectable element socket contacts may extend beyond the connection side of the substrate; an underfill process that may include providing a fill formation surface over ends terminating the end connection portions of the plurality of deflectable element socket contacts, providing fill material between the fill formation surface and the connection side of the substrate, and removing the fill formation surface exposing the ends terminating the end connection portions of the plurality of deflectable element socket contacts; and an insertion process that may include providing a plurality of deflectable element socket contacts along a removable holding member, inserting one or more of the plurality of deflectable element socket contacts along the removable holding member into a plurality of corresponding openings, and removing the holding member from the deflectable element socket contacts inserted in corresponding openings.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

DETAILED DESCRIPTION OF EXEMPLARY EMBODIMENTS

Figure 1:
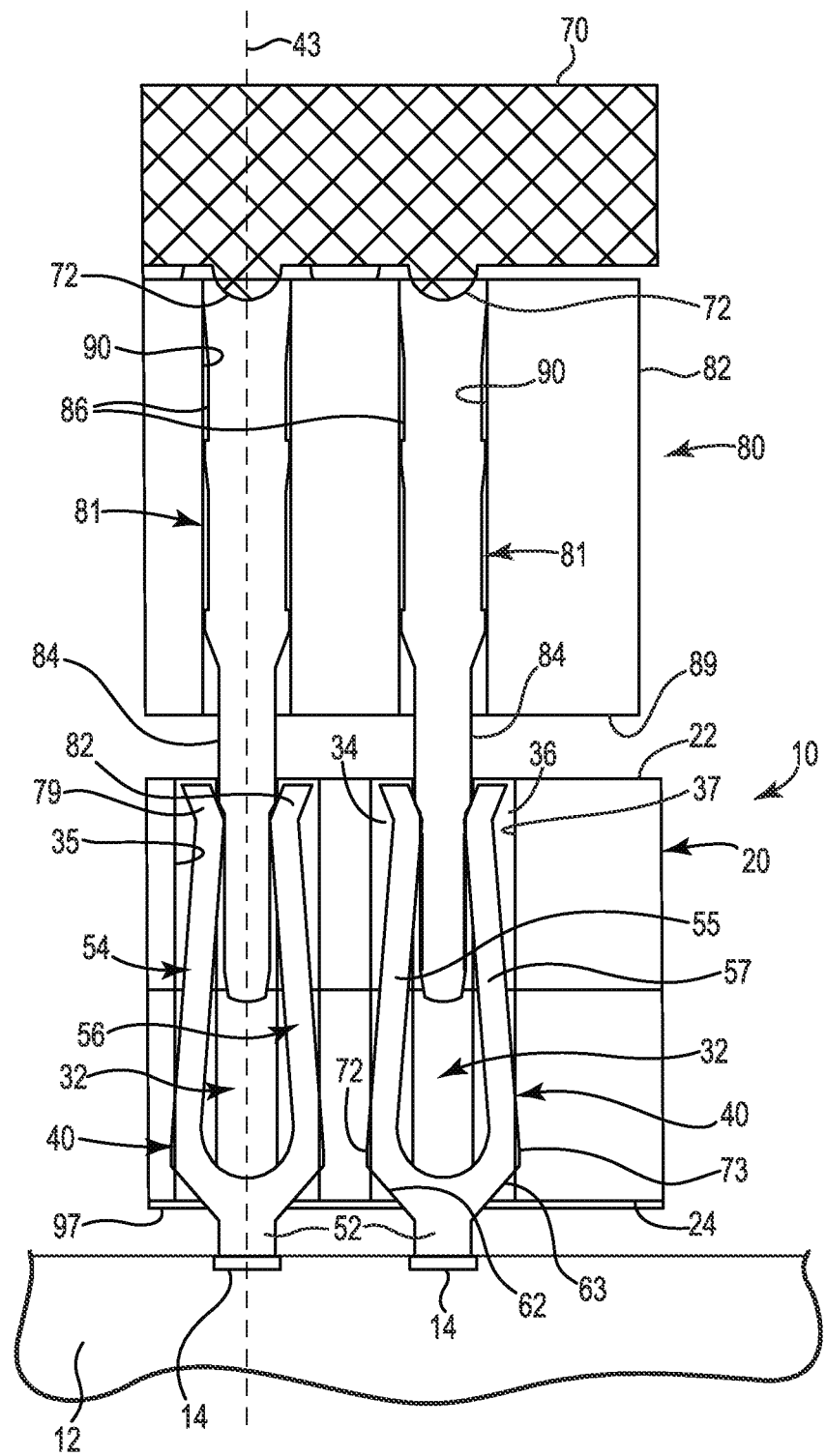
FIG. 1 is a generalized illustrative diagram of one exemplary embodiment of a portion of an adapter apparatus including deflectable element socket contacts for use in mounting a packaged device relative to a target board.

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary adapter apparatus and methods for providing same shall generally be described with reference to FIGS. 1-6. It will be apparent to one skilled in the art that elements from one embodiment may be used in combination with elements of the other embodiments, and that the possible adapter apparatus embodiments using features set forth herein is not limited to the specific embodiments described. Further, it will be recognized that the embodiments described herein will include many elements that are not necessarily shown to scale. Further, it will be recognized that the size and shape of various elements herein may be modified without departing from the scope of the present disclosure, although one or more shapes and sizes may be advantageous over others.

FIG. 1 shows a generalized diagrammatic view of an exemplary adapter apparatus 10. The adapter apparatus 10 includes a substrate 20. Substrate 20 comprises a body of material extending between a first surface or pin receiving side 22 and a second surface or connection side 24. In one embodiment of substrate 20, the first and second surfaces are planer surfaces that generally lie parallel to one another.

The substrate 20 may be formed of any suitable insulative material (e.g., polyimide materials, laminate materials, etc.). In one embodiment, substrate 20 is formed of a high temperature material (e.g., a material that is suitable for use in temperatures that exceed 125 degrees C.). For example, the substrate 20 may be formed of one or more materials such as polyetheretherketone (PEEK), Ceramic filled PEEK or other grades of PEEK, Torlon, FR4, G10, Kapton, or Rogers R04350. Further, in one or more embodiments, the substrate 20 may be formed of multiple layers of laminate materials (e.g., such laminate materials may be partially cured, for example, half cured, at the start of manufacturing the assembly and later fully cured such as after the socket contacts are inserted). Further, for example, when laminating multiple layers, one or more of the layers may be partially cured (e.g., half cured). This may allow for holding of the inserted deflectable element socket contact and allow flows around it when cured. In such a manner, the socket contact may be inserted without stressing the substrate 20.

In one embodiment, the substrate 20 may be of a size generally equivalent to a packaged device (e.g., packaged device 70) which is to be mounted using the adapter apparatus 10. However, one skilled in the art will recognize that the size and shape of the substrate 20 may vary based on the application of the adapter apparatus (e.g., the adapter apparatus may be configured to mount more than one packaged device, may be adapted to mount different types of packages, etc.).

The present invention may be used to mount various types of packaged devices, including, but not limited to, for example, surface mount devices, such as ball grid array packages, land grid array packages, quad flat no leads (QFN) devices, column grid array packages, non-solder ball packages, other packaged devices with surface mount pads, etc. One will recognize that the configuration of the adapter apparatus may be different depending on the type of the packaged device being mounted (e.g., the apparatus being different or the same for a package including solder balls versus a non-solder ball package).

As shown in FIGS. 1-3, in one or more embodiments, the substrate 20 includes a plurality of openings 30 defined through the substrate 20 in which a plurality of deflectable element socket contacts 40 are provided. In various figures of this application, for simplicity, only several openings 30 have socket contacts 40 provided therein. However, all or just some of such openings 30 may have socket contacts 40 therein.

The openings 30, for example, as shown in FIG. 1, are defined through substrate 20 from pin receiving side 22 to connection side 24 of substrate 20; the pin receiving side 22 being opposite the connection side 24. The size and shape of the openings 30 is dependent upon the structure of the deflectable element socket contacts 40 to be provided (e.g., mounted, press-fit, etc.) in corresponding openings 30.

In one or more embodiments, as shown in FIGS. 1-3, the substrate 20 may include a plurality of openings 30 defined in any number of configurations (e.g., along columns and/or rows, defined diagonally relative to the x and y axes of the adapter (i.e., the x and y axes being orthogonal to the axis 43), defined at various locations, concentrated towards the edges and/or towards the center portion of the substrate, etc.). In other words, any number or configuration of the openings 30 may be used. In one or more embodiments, the deflectable element socket contacts need to be of a certain dimension to provide proper force and contact (e.g., enabling less resistance for current flow). To maintain a certain dimension of the adapter, the socket contacts may be held in openings arranged diagonally (e.g., relative to the x and y axes, relative to the side walls of the device package, etc.). Socket contacts arranged in such diagonal manner may reduce the space needed for such contacts (e.g., 1.414 times compared to the contacts positioned parallel to the x or y axes and being held along rows parallel to the x or y axes).

Further, each opening 30 of the plurality of openings, as shown, for example, in FIGS. 3A-3D, includes a center pin receiving region 32 and the first and second deflection regions 34, 36. Generally, each of the first and second deflection regions 34, 36 are defined by one or more deflection region surfaces 35, 37, respectively, opposite the other and adjacent the center pin receiving region 32. In other words, the first and second deflection regions 34, 36 are defined on opposite sides of the center pin receiving region 32. Further, the center pin receiving region 32 is defined by one or more pin receiving region surfaces 33 (e.g., two opposing surfaces located along axis 43 between the one or more deflection region surfaces 35, 37). Such center pin receiving region 32 and first and second deflection regions 34, 36 are defined in an open relationship to one another so as to form a continuous opening 30 from the pin receiving side 22 of substrate 20 to the connection side 24 of substrate 20 (e.g., allowing portions of the socket contact 40 to be deflected or expand from the center pin receiving region 32 into first and second deflection regions 34, 36 when a male pin is inserted into the socket contact 40).

Figure 2A:
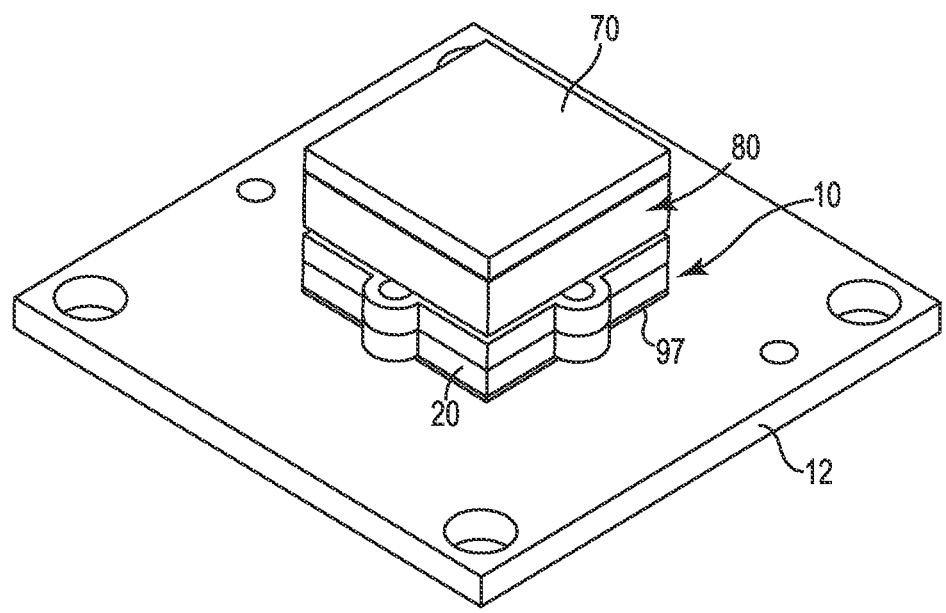
FIG. 2A is a perspective view of one exemplary embodiment of an adapter apparatus including features such as illustratively shown in FIG. 1.
Figure 2B:
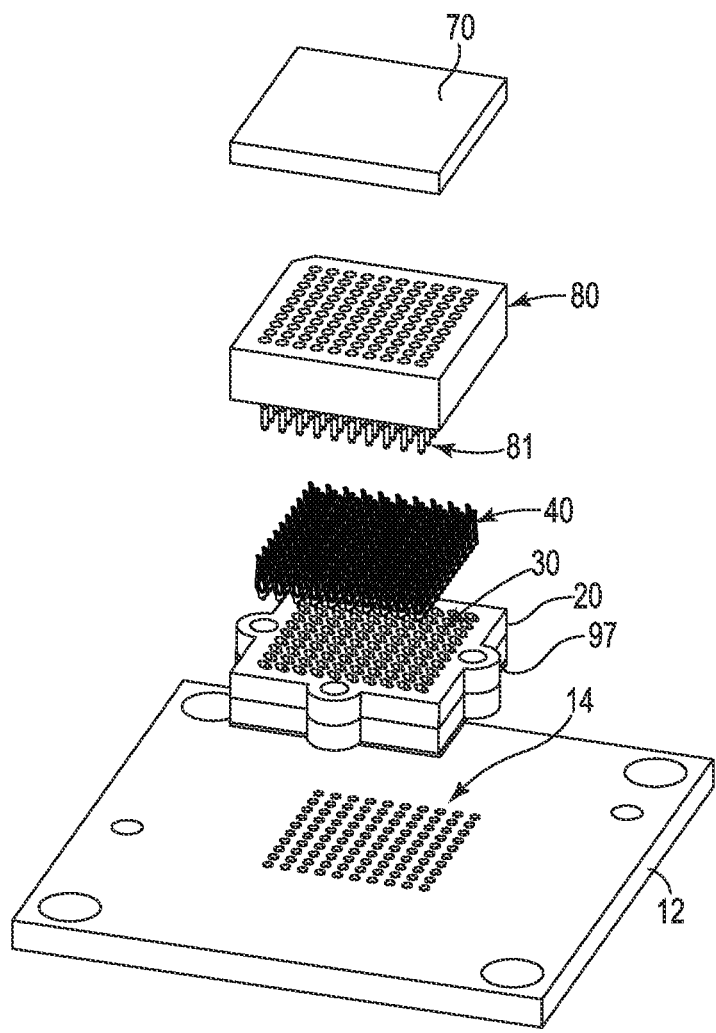
FIG. 2B is an exploded perspective view of the exemplary embodiment of an adapter apparatus shown in FIG. 1.
Figure 2C:
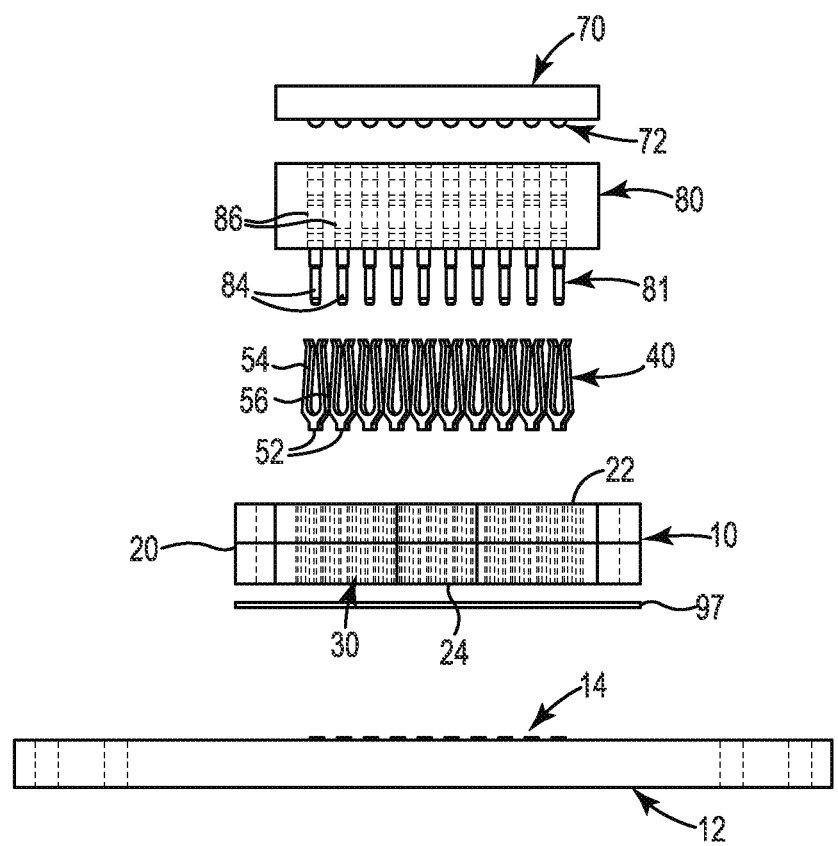
FIG. 2C is an exploded side view of the exemplary embodiment of the adapter apparatus of FIG. 2B.
Figure 3A:
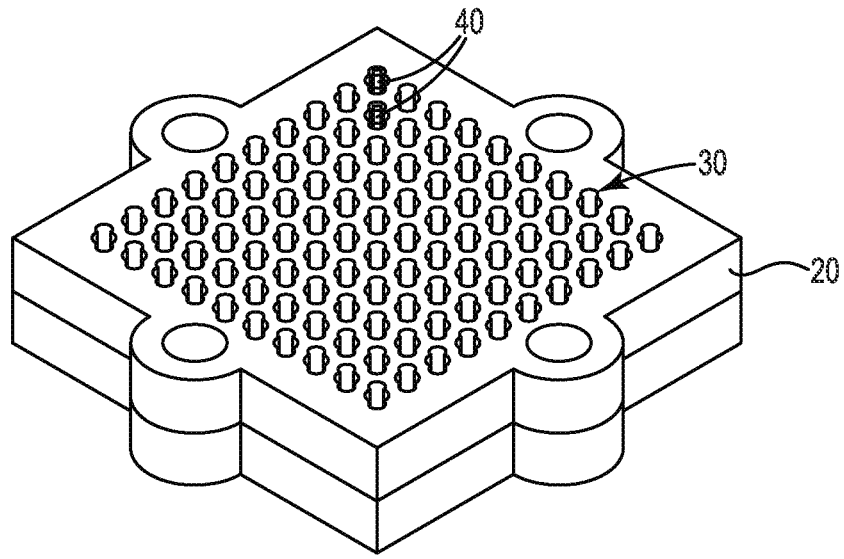
FIGS. 3A-3D show a perspective view, plan view, a more detailed plan view of a portion thereof, and yet still a more detailed plan view of one opening of such a portion, respectively, of an exemplary embodiment of a substrate usable to provide an adapter apparatus such as the adapter apparatus of FIGS. 2A-2C.
Figure 3B:
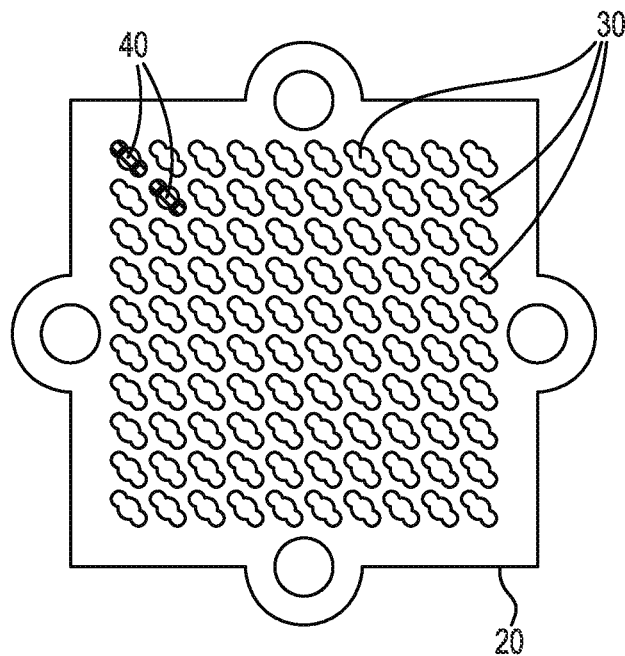
Figure 3C:
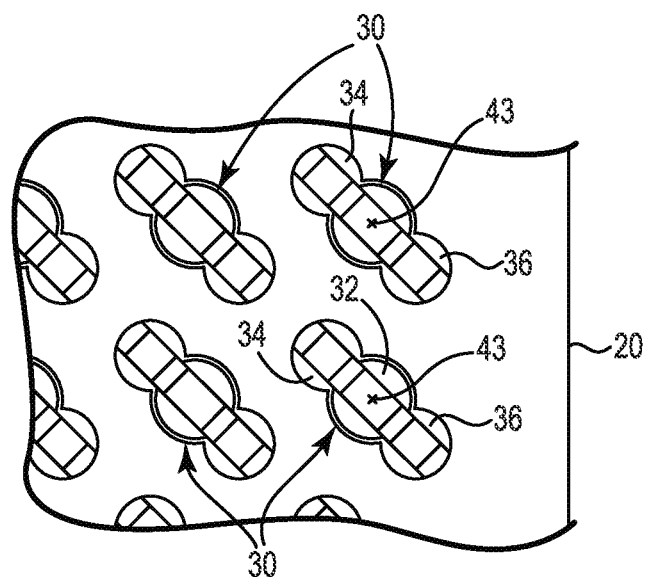
Figure 3D:
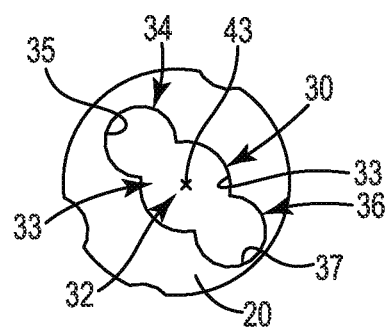
Figure 4A:
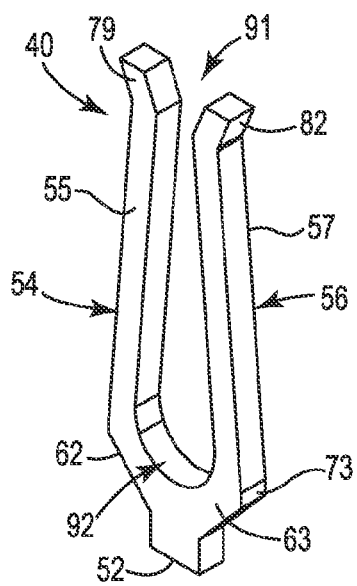
FIGS. 4A-4D show an illustrative perspective view, a plan view, a side view, and a top view of an exemplary deflectable element socket contact in its normal undeflected state for use in providing an adapter apparatus such as the adapter apparatus of FIGS. 2A-2C.
Figure 4B:
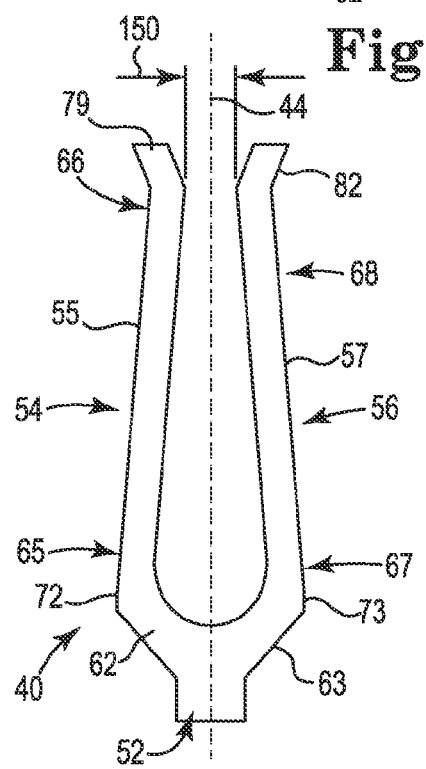
Figure 4C:
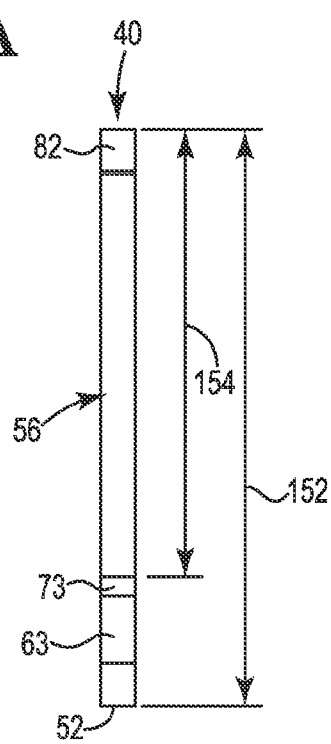
Figure 4D:
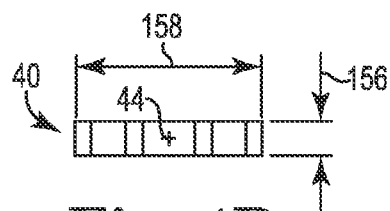

As shown in FIGS. 1-3, at least in one embodiment, the openings 30 are symmetric about a plane extending through and including axis 43 (e.g., a plane orthogonal to a cross-section taken perpendicularly to axis 43; or in other words, a plane extending into the page of FIG. 3D including axis 43). Further, in one or more embodiments, the various regions of the openings 30 may be defined using different diameter surfaces defining different portions thereof, for example, along axis 43. For example, in one or more embodiments, the center pin receiving region 32 may include a center cylindrical region along axis 43 having a diameter that is greater than the diameter of a male pin to be received therein. As shown in FIG. 3D, for example, such a center cylindrical region may be defined by opposing pin receiving region surfaces 33. Further, for example, in one or more embodiments, each of the first and second deflection regions 34, 36 may include a cylindrical region along axis 43 having a diameter. In one or more embodiments, the cylindrical regions defining the first and second deflection regions 34, 36 may have a diameter that is less than the diameter of the center cylindrical region defining the center pin receiving region 32. Still further, at least in one embodiment, the diameter or cross-sectional area of the first and second deflection regions 34, 36 are sized to allow for deflection of one or more portions of the socket contact 40 into such regions 34, 36.

One will recognize that the shape (e.g., cross-sectional shape) of the regions need not be cylindrical but may be any cross-sectional shape (e.g., oval, elliptical, square, rectangular, etc.) that provide suitable functionality as described further herein (e.g., allow for receiving a male pin, allow for deflection of portions of a deflectable element socket contact provided in the opening, hold the deflectable element socket contact within the opening, etc.). In other words, various configurations of such openings with different defining surfaces may be used to accommodate mounting of the deflectable element socket contact 40 and allow for deflection of portions thereof when a male pin is received by the deflectable element socket contact 40. The various surfaces (e.g., deflection region surfaces 35, 37; pin receiving region surfaces 33, etc.) defining one or more regions of the openings 30 may be formed by drilling one more holes or regions through the substrate 20, etching one or more holes or regions through the substrate 20, or any other suitable process.

Conductive deflectable element socket contacts 40 are provided (e.g., mounted, for example, using an interference fit) in each opening 30 defined through the substrate 20. The deflectable element socket contacts 40 may be provided in the openings 30 in any suitable manner (e.g., using any suitable structure, such as using particular dimensional configurations of the walls defining the openings 30 or regions thereof, etc.) so as to allow a male pin (e.g., such as elongated male pin 81) to be inserted into the center pin receiving region 32 and within the deflectable element socket contact 40 as described herein. For example, in one or more embodiments, such deflectable element socket contacts 40 may be positioned within the openings 30 using apparatus such as described with reference to FIGS. 5-6 herein.

In at least one embodiment, each of the plurality of deflectable element socket contacts 40 is flat (e.g., including generally planar and parallel sides). Such socket contacts 40 may be formed in any suitable manner. For example, such deflectable element socket contacts 40 may be formed by etching (e.g., chemical and/or physical etching), stamping, conventional milling, laser cutting, etc. Such deflectable element socket contacts 40 may be formed, in one or more embodiments, from a planar layer of material having a thickness greater than 4 mils and/or less than two thirds the diameter of a male pin being received thereby. In one or more embodiments, the deflectable element socket contacts may be formed separately and/or together (e.g., as part of a structure such as shown in FIGS. 5-6).

Further, in one or more embodiments, the deflectable element socket contacts may be formed using one or more suitable conductive materials for providing desired electrical conduction and one or more suitable deflectable material (e.g., one or more materials that have a certain degree of spring action, one or more materials that are deflectable by a force to a state other than normal and returnable to the normal state after the force is removed, etc.). For example, such conductive socket contacts (e.g., plated or solid) may be formed of brass alloy, beryllium/copper alloy, etc. Further, for example, such socket contacts may be plated using, for example, nickel, gold, rhodium, or any alloy thereof. For example, the deflectable element socket contacts 40 may be formed of beryllium copper alloy.

As shown in FIGS. 1 and 4, in one or more embodiments, each of the plurality of deflectable element socket contacts 40 may include an end connection portion 52 and first and second deflectable elements 54, 56. For example, the first deflectable element 54 may be coupled to the end connection portion 52 and provided at least partially in the first deflection region 34 with a portion thereof in contact with at least a portion of the one or more deflection region surfaces 35 defining the first deflection region 34. Likewise, the second deflectable element 56 may be coupled to the end connection portion 52 and provided at least partially in the second deflection region 36 with a portion thereof in contact with at least a portion of the one or more deflection region surfaces 37 defining the second deflection region 36. In one or more embodiments, the first and second deflectable elements 54, 56 may be configured to deflect within the first and second deflection regions 34, 36, respectively, when a male pin 81 is received in the pin receiving region 32 and in contact between the first and second deflectable elements 54, 56.

In one or more embodiments, the first and second deflectable elements 54, 56 are symmetrical about an axis 44. At least in one embodiment, the axis 44 is coincident with axis 43 of an opening 30 when the deflectable element socket contact 40 is provided therein. Further, the first and second deflectable elements 54, 56 may be spaced apart by a distance 150 suitable to receive a male pin 81 therebetween (e.g., based on the diameter of the male pin 81). Further, at least in one embodiment, the first and second deflectable elements 54, 56 may be spaced apart by a greater distance towards the connection side 24 of the substrate 20 than towards the pin receiving side 22 of the substrate 20. In one or more embodiments, the first and second deflectable elements 54, 56 may be spaced apart by a distance 150 that is less than the diameter of a male pin 81 to be received thereby (e.g., at a location towards the pin receiving side 22 of substrate 20). In at least one embodiment, the distance 150 may be greater than about 0.0045 inches and/or the distance 150 of the socket contact 40 may be less than about 0.006 inches.

As shown, for example, in FIGS. 1 and 4, each of the first and second deflectable elements 54, 56 may include an elongate portion 55, 57, respectively. In one or more embodiments, the elongate portion 55 of the first deflectable element 54 extends from a first end region 65 located within the first deflection region 34 and coupled to end connection portion 52 to a second end region 66 located at least in part within the pin receiving region 32. Likewise, for example, the elongate portion 57 of the second deflectable element 56 extends from a first end region 67 located within the first deflection region 36 and coupled to end connection portion 52 to a second end region 68 located at least in part within the pin receiving region 32. Further, at least in one embodiment, when positioned within a corresponding opening 30, the second end regions 66, 68 of each of the first and second deflectable elements 54, 56, respectively, are located towards the pin receiving side 22 of the substrate 20 and spaced at a distance from the one or more deflection region surfaces 35, 37 defining the first and second deflection regions 34, 36 (e.g., to allow for deflection of the second end regions 66, 68).

At least in one embodiment, each of the elongate portions 55, 57 of the first and second deflectable elements 54, 56, respectively, may be coupled to the end connection portion 52 by a transition portion 62, 63, respectively. The transition portions 62, 63 assist in centering the end connection portion 52 at the connection side 24 of the substrate 20 relative to the pin receiving region 32 within opening 30. In one or more embodiments, the transition portions 62, 63 include a contact surface 72, 73, respectively. For example, such contact surfaces 72, 73 may include a relatively flat surface (e.g., parallel to axis 44), a roughened surface, or any other type of surface that assists in holding the deflectable element socket contact 40 within the opening 30. For example, in at least one embodiment, the flat contact surfaces 72, 73 are in contact with at least a portion of the one or more deflection region surfaces 35, 37 defining the first and second deflection regions 34, 36, respectively, to provide, for example, an interference fit of the deflectable element socket contact 40 within the opening 30. Further, as described herein, such a fit of the deflectable element socket contact 40 within the opening 30 (e.g., provided by two opposing points of interference between the deflectable element socket contact 40 and opposing deflection region surfaces 35, 37) provide a certain degree of stability of the deflectable element socket contact 40 within the opening 30 such that rocking of the socket contact 40 within the opening 30 is reduced (e.g., when a male pin 81 is being inserted into the socket contact 40).

In one or more embodiments, each of the first and second deflectable elements 54, 56 terminates towards the pin receiving side 22 of the substrate 20 at a chamfered region 79, 82, respectively, to assist in centering a male pin 81 when inserted into the pin receiving region 32 of the opening 30. The chamfered regions 79, 82 may take any form for assisting in receipt of the male pin 81. For example, the chamfered regions 79, 82 may be tapered in a direction away from axis 44; whereas the elongate portions 55, 57 have a taper from the connection side 24 of the substrate 20 to the pin receiving side 22 of the substrate 20 that tapers in a direction towards axis 44. At least in one embodiment, the intersection between the chamfered regions 79, 82 and the remainder of the first and second deflectable elements 54, 56, respectively, forms a shoulder for contact of the male pin 81 when inserted therebetween. Such shoulder may function to assist in stopping the insertion of the male pins 81 into the pin receiving regions 32. Each of the first and second deflectable elements 54, 56 (e.g., the chamfered regions 79, 82) may terminate towards the pin receiving side 22 of the substrate 20 (e.g., they may extend beyond the pin receiving side 22, may be flush with the pin receiving side 22, or terminate within the opening 30, for example, at a recessed distance from the pin receiving side 22).

The deflectable element socket contact 40 may be of various dimensions. In at least one embodiment, the total length 152 is as small as possible to provide the shortest electrical path. For example, in one or more embodiments, the total length 152 of the socket contact 40 may be greater than about 0.060 inches; the total length 152 of the socket contact 40 may be less than about 0.075 inches; the length 154 of the deflection element 55, 57 may be greater than about 0.05 inches; the length 154 of the deflection element 55, 57 (e.g., to allow low force contact with the pin) may be less than about 0.065 inches (e.g., the length 154 may be based on a length sufficient to apply an adequate force on the male pin 81 when inserted into the socket contact 40); the thickness 156 of the socket contact 40 may be greater than about 0.003 inches; the thickness 156 of the socket contact 40 (e.g., defined by manufacturability) may be less than about 0.005 inches; the width 158 of the socket contact 40 (e.g., from the flat contact surface 72 to flat contact surface 73) may be greater than about 0.018 inches; and the width 158 of the socket contact 40 (e.g., defined by the pith of two adjacent contacts) may be less than about 0.022 inches. In one or more embodiments, the length 154 of each of the first and second deflectable elements 54, 56 is at least twice the width 158.

The deflectable element socket contact 40, at least in one embodiment, may be referred to as a flat U-shaped socket contact having an open end 91 and a closed end 92. The open end 91 may be dimensionally configured such that a male pin inserted into the open end 91 of the socket contact 40 contacts and spreads or expands the structure forming the open end 91. The closed end 92 may be dimensionally configured to avoid contact with the male pin inserted within the socket contact 40 (e.g., the closed end 92 may have a radius associated therewith that is greater than the radius of the male pin 81). The closed end 92 may be sized to provide an interference fit of the U-shaped socket contact within the opening 30 (e.g., when press-fit into the opening) and may be coupled to end connection portion 52.

One will recognize that various portions of the deflectable element socket contact 40 need not be flat. For example, the elongate portions 55, 57, as well as other portions of the socket contact 40, may be cylindrical, elliptical, etc. Further, for example, the elongate portions 55, 57, as well as other portions of the socket contact 40, need not be a linear. For example, such portions may be nonlinear (e.g., curved, arcs, etc.).

End connection portion 52 may be of any suitable configuration for providing contact, direct or indirect, with one or more conductive elements, such as conductive pads 14 on a target board 12 (e.g., a printed circuit board). For example, the end connection portion 52 may extend beyond or be flush with connection side 24 of substrate 20 and be directly or indirectly connected to one or more conductive elements. In other words, the end connection portion may be soldered directly to a conductive element 14 on a target board 12, or may be indirectly connected to such a conductive element via one or more intermediate conductive structures or elements. Further, for example, in one or more embodiments, the connection portion 52 may be recessed relative to the connection side 24 of the substrate 20 and/or be flush therewith. For example, in such a configuration, one or more intermediate conductive structures or elements may be used to indirectly connect the end connection portion 52 to a conductive element 14 on target board 12. Still further, the end connection portion 52 may terminate in one or more various shapes (e.g., rectangular, elliptical, circular, etc.).

Still further, in one or more embodiments, the end connection portion 52 may be attached to a contact 14 on target board 12 by any suitable structure or process. At least in one embodiment, the end connection portion 52 may be configured for receipt of solder material (e.g., a solder ball, solder sphere, bump, or column) thereon. Depending on the type of material used to form the end connection portion 52 and the application of the adapter apparatus, at least in one embodiment, solder material may not be needed thereon (e.g., a gold end that can be otherwise soldered to the target board without the need to prevent the end from oxidation).

The insertion of the deflectable element socket contacts 40 within the openings 30 may result in open regions between the end connection portions 52 and the various surfaces (e.g., deflection region surfaces 35, 37; pin receiving region surfaces 33, etc.) defining the openings 30. At least in one embodiment, a blocking structure 97 (e.g., a blocking layer) is provided at the connection side 24 of substrate 20 to prevent material (e.g., solder) from creeping or wicking up the end connection portions 52 into the opening 30 along the socket contact 40, such as when, for example, the adapter apparatus 10 is being soldered down and onto target board 12. If such creeping and/or wicking occurs, the solder joint may be weakened.

The blocking structure 97 may be provided in any suitable form that blocks material from entering opening 30 at the connection side 24 (e.g., seals the socket pin tips). For example, at least in one embodiment, the blocking structure 97 may be a thin layer (e.g., about 2 mils thick) of electrically insulative material (e.g., Kapton material or tape) positioned at the connection side 24 with the end connection portions 52 extending therethrough. For example, in one or more embodiments, the layer of material 97 may be a layer having a plurality of slots formed therein (e.g., laser cut, etched, etc.) corresponding in size to the end connection portions 52 (e.g., the same or slightly smaller than the end connection portions 52 so as to block material from entering opening 30 when the layer is placed over the end connection portions 52 and onto the connection side 24 to cover open regions between the end connection portions 52 and the surfaces defining opening 30).

Figure 7A:
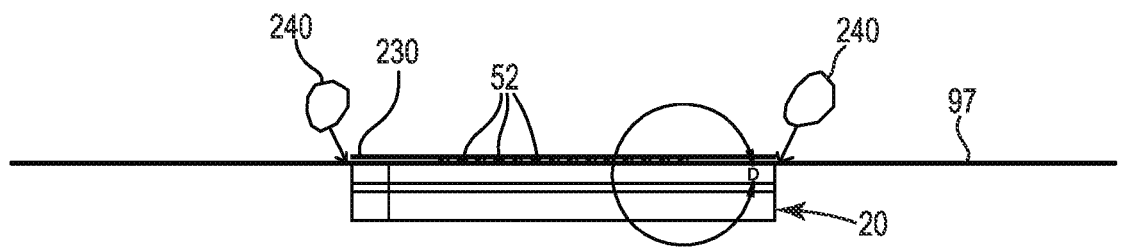
FIGS. 7A-7C show a side, a more detailed portion thereof, and a cut-away view, respectively, of one exemplary embodiment for use in illustrating one exemplary underfill process usable to provide one embodiment of an adapter apparatus.
Figure 7B:
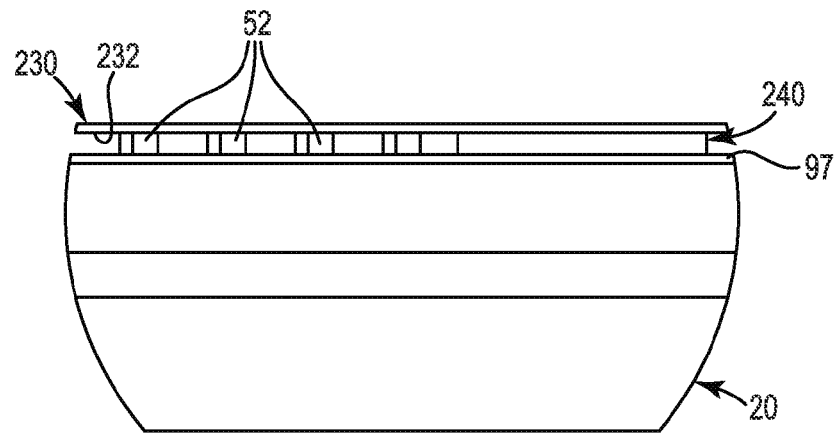
Figure 7C:
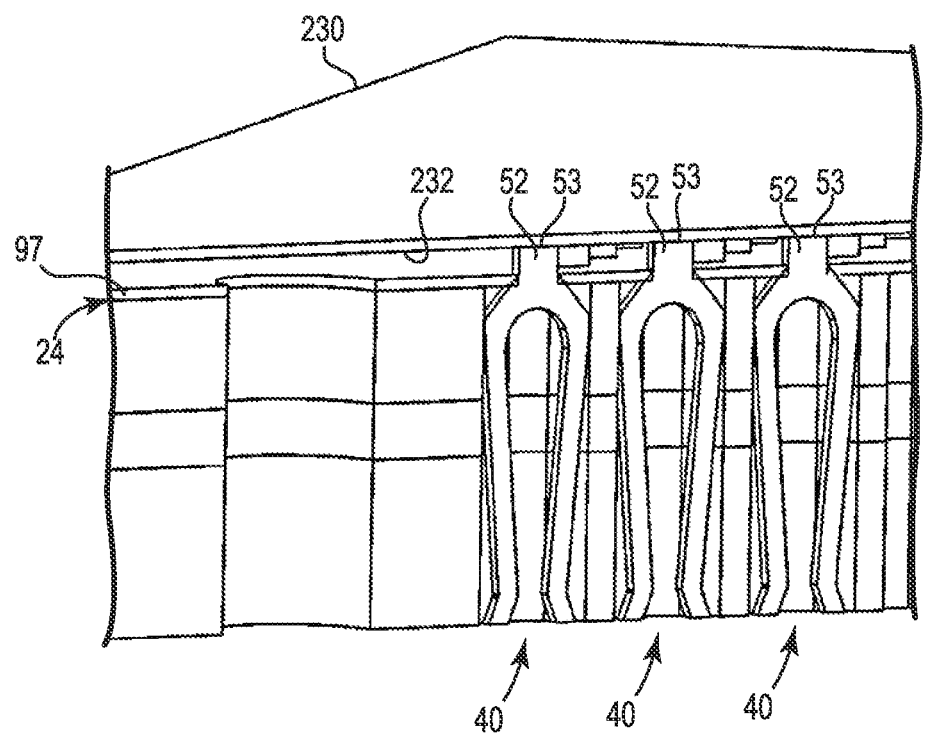
Figure 8A:
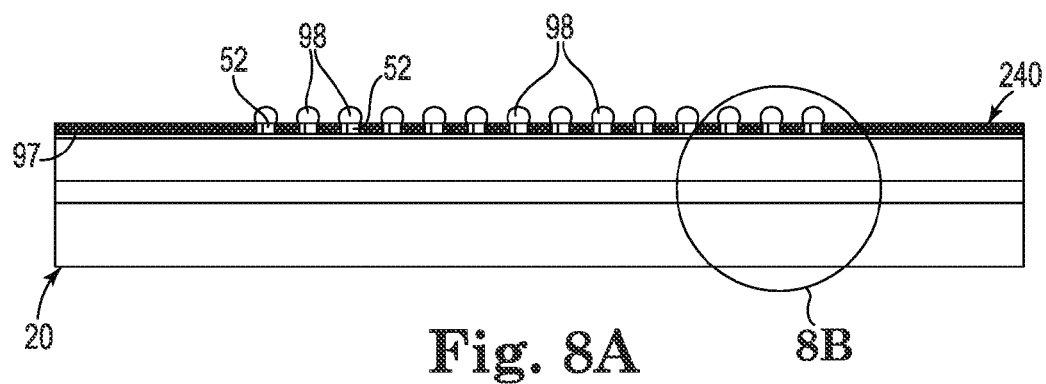
FIGS. 8A-8B show a side view and a more detailed portion thereof, respectively, of one exemplary embodiment of an adapter apparatus such as formed using the process, illustrated in, for example, FIGS. 7A-7C.
Figure 8B:
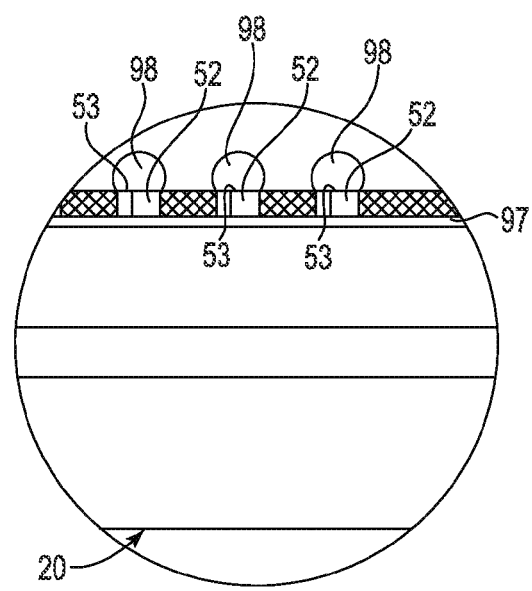

FIGS. 7A-7C show a side view, a more detailed portion thereof, and a cut-away view, respectively, of one exemplary embodiment for illustrating the formation of one or more connection structures usable for attachment of the end connection portions 52 of the plurality of deflectable element socket contacts 42 target board 12 (e.g., a fill or underfill process used to provide a connection structure at the connection side 24 of substrate 20). FIGS. 8A-8B show a side view and a more detailed portion thereof, respectively, of one exemplary embodiment of such a connection structure.

As shown in the figures, for example, FIG. 7C, end connection portions 52 may extend beyond the connection side 24 of substrate 20. Further, as shown in FIGS. 7A-7C, a fill formation surface 232 of a formation structure 230 (e.g., a planar surface of a layer of material) may be provided over ends 53 which terminate the end connection portions 52 of the plurality of deflectable element socket contacts 40. Yet further, with the blocking layer 97 provided at the connection side 24 of the substrate 20 to block material from entering openings 30 defined through the substrate 20, a fill material 240 may be provided between the fill formation surface 232 and the connection side 24 of substrate 20.

The formation structure 230 may be formed of any suitable material to provide a mold surface adjacent the ends 53. For example, the formation structure 230 may be provided in the form of a tape, e.g., Kapton tape, etc., or any other types of layer or layers of material (e.g., applied over the ends 53 alone or using any other structure).

The fill material 240 may be any suitable flowable material that may work its way into and around end connection portions 52. For example, the flowable fill material 240 may fill the region between the fill formation surface 232 and the connection side 24 by capillary action in and around the end connection portions 52. In one or more embodiments, the fill material 240 may be an epoxy, or any other suitable electrically insulative material. Further, in one or more embodiments, the fill material 240 may be a material curable by any known process (e.g., room temperature curing, thermal curing, chemical curing, etc.)

After the fill material 240 is cured, the fill formation surface 232 may be removed exposing the ends 53 terminating the end connection portions 52 of the plurality of deflectable element socket contacts 40. At least in one embodiment, when the fill formation surface 232 is provided as a tape layer, the removal of the fill formation surface 232 may be as simplistic as peeling back the tape. In one or more embodiments, the ends 53 of the end connection portions 52 may not be completely exposed or exposed at all. In such a case, one or more additional processes to remove and at least partially expose (e.g., fully expose) the ends 53 may be performed (e.g., planarization, chemical or physical etching, etc.).

One exemplary resulting connection structure (e.g., with the fill formation surface 232 removed) is shown in FIGS. 8A-8B. As shown therein, the resulting connection structure includes the end connection portions 52 insulated from one another by the cured fill material 240. Further, the resulting connection structure may include a plurality of solder balls/spheres 98 applied to the ends 53 of the end connection portions 52. Such solder balls/spheres 98 may then be used for connection to connection pads 14 of target board 12.

The deflectable element socket contacts 40, in one or more embodiments, are configured for mounting in openings 30 of a substrate 20 where the pitch of the contacts of the adapter apparatus is in the range of about 0.3 mm to about 0.75 mm. The deflectable element socket contacts 40 may be configured (e.g., the first and second deflectable elements may be effectively spaced apart) so as to provide effective contact with a male pin 81 when the male pin 81 is inserted through the center pin receiving region 32 and between the first and second deflectable elements 54, 56. The conductive deflectable element socket contacts 40 shown in FIG. 1 may be referred to as female sockets (e.g., female socket pins) mounted in corresponding openings 30 defined through substrate 20 for receiving male pins 81. In other words, as the adapter apparatus 10 includes female socket type contacts 40, a male pin adapter 80 may be used in conjunction therewith to mount a device (e.g., a BGA device 70) to the target board 12.

For example, as shown in FIGS. 1-2, in one or more embodiments, the male pin adapter 80 may include a substrate 82 with a plurality of male terminal pins 81 mounted therethrough. Each of the male terminal pins 81 may include a pin portion 84 configured to be received in the deflectable element socket contact 40 of adapter apparatus 10 and a contact portion 86 for providing electrical contact with a solder ball 72 of the device 70 (e.g., either directly or indirectly through another board, which may be an interposer, another adapter apparatus, etc.).

The male adapter apparatus 80 as shown in FIG. 1 and FIGS. 2B-2C may include the substrate 82 having a plurality of openings 90 defined therethrough for receiving and holding the plurality of male terminal pins 81 configured for mating with the adapter apparatus 10 (e.g., press-fit in the openings 90). The male adapter apparatus 80 may be configured in any suitable manner for presenting the pins to mate with the deflectable element socket contacts 40 of the adapter apparatus 10. For example, various components may be used to assist the mating of the male terminal pins 81 with the contacts 40. For example, one or more alignment structures may be used around the perimeter of the substrate 82 to align male pin adapter 80 with adapter apparatus 10 (e.g., and thus, alignment of the male pins 81 with the axis 43 of the openings 30 having contacts 40 therein).

Further, for example, as shown in FIG. 1 and not to be considered limiting to the disclosure presented herein, the adapter apparatus 10 may be employed to mount a packaged device 70 (e.g., a BGA package) to target board 12. Target board 12 may include a pattern of contact elements 14 corresponding to a plurality of solder balls 72 of the ball grid array device 70. The solder balls 72 may be provided on a pattern of contact pads of the ball grid array device 70.

Solder material, as used herein, may be any suitable type of solder material generally known in the art. Such suitability will generally depend on the application for which the adapter apparatus is being used. For example, the solder material may include solder balls as shown in FIG. 1, solder films, solder spheres, partial solder spheres, solder columns, or any other suitable size and shape of material. Further, for example, the solder material may include eutectic 63/37 SnPb solder balls or solder spheres, or may be formed of lead free solder alloys such as SAC305 (Sn,Ag3.0,Cu0.5).

In one or more embodiments, the deflectable element socket contacts 40 when provided in corresponding openings 30 are generally in a normal state (e.g., when male pins 81 have not been inserted therein). Further, as the male pins 81 are inserted into the pin receiving regions 32 (e.g., centered by chamfered portions 79, 82) the deflectable elements 54, 56 expand into the deflection regions 34, 36, respectively, which move the deflectable element socket contacts 40 from their normal state into a deflected state where the deflectable element socket contacts 40 are effectively electrically connected with the male pins 81. In one or more embodiments, upon insertion of multiple male pins 81 into such deflectable element socket contacts 40, back forces on the multiple male pins 81 are created which effectively stop the insertion. For example, in at least one embodiment, the adapter is configured such that a gap (e.g., of a distance in the range of about 3 mils to about 5 mils) exists between the pin receiving side 22 of substrate 20 and the lower surface 89 of substrate 82 of pin adapter 80. Such a gap is beneficial such that the male adapter may be pulled out from the female socket using bent tools that are less than about 5 mils (e.g., inserted between the pin receiving side 22 and the bottom surface 89).

FIGS. 2B-2C show an exploded perspective view and an exploded side view, respectively, of one exemplary embodiment of components of the adapter apparatus 10 and male pin adapter 80, such as shown assembled in the perspective view of FIG. 2A. The adapter apparatus 10 includes the substrate 20, including the pin receiving side 22 and connection side 24 spaced apart therefrom. The adapter apparatus 10 further includes the conductive deflectable element socket contacts 40 to be mounted within openings 30 defined through substrate 20. The conductive deflectable element socket contacts 40 may be provided within the openings 30 using an interference fit such as described herein, or may be mounted within the openings 30 in any other suitable manner.

Figure 5A:
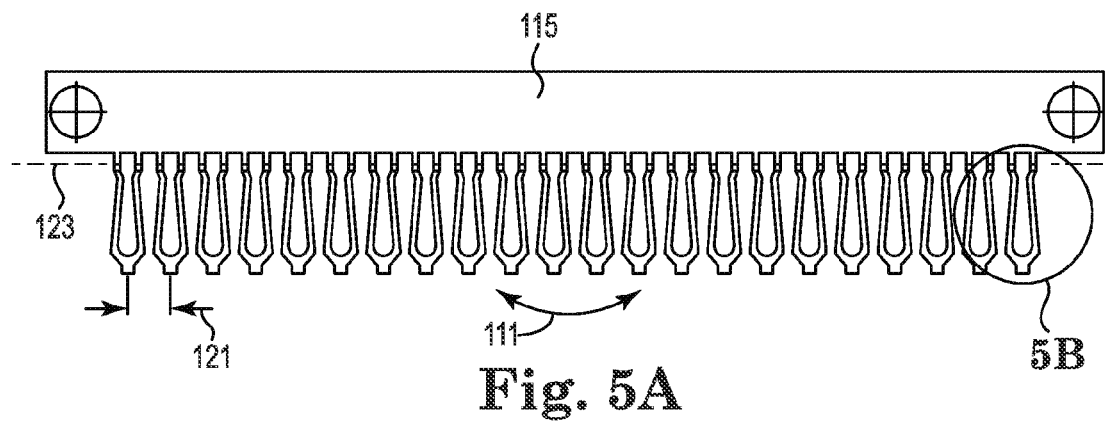
FIGS. 5A-5C show a plan view, a more detailed plan view of a portion thereof, and a side view, respectively, of one exemplary embodiment of a plurality of deflectable element socket contacts attached to a holding member usable to provide an adapter apparatus such as the adapter apparatus of FIGS. 2A-2C.
Figure 5B:
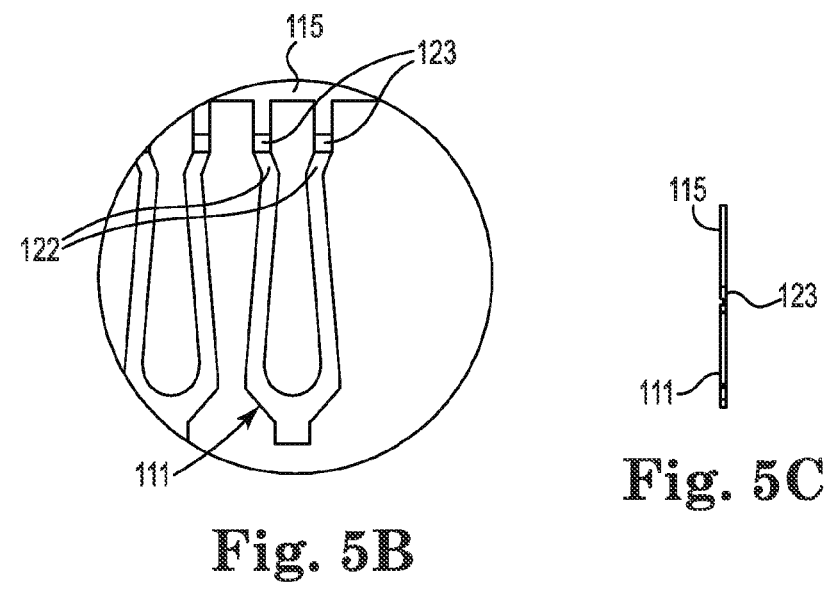
Figure 5C:
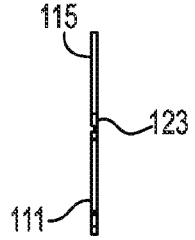
Figure 6A:
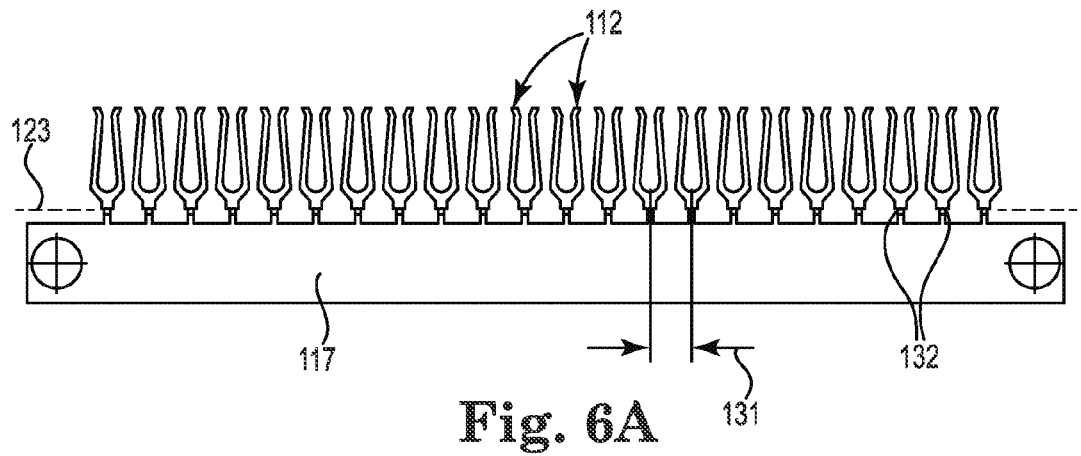
FIGS. 6A-6C show a plan view, a side view, and a more detailed view of a portion of the side view, respectively, of another exemplary embodiment of a plurality of deflectable element socket contacts attached to a holding member usable to provide an adapter apparatus such as the adapter apparatus of FIGS. 2A-2C.
Figure 6B:
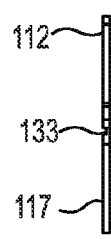
Figure 6C:
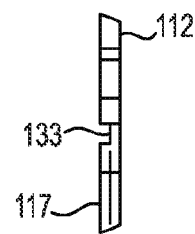

The deflectable element socket contacts 40 may be provided for assembly in one of various manners (e.g., as separate contacts, as a plurality of space apart contacts, etc.). For example, at least in one embodiment, the plurality of deflectable element socket contacts may be provided as shown in FIGS. 5-6. FIGS. 5A-5C show a plan view, a more detailed plan view of a portion thereof, and a side view, respectively, of one exemplary embodiment of a plurality of deflectable element socket contacts 111 attached to a removable holding member 115 usable to provide an adapter apparatus such as the adapter apparatus of FIGS. 2A-2C. FIGS. 6A-6C show a plan view, a side view, and a more detailed view of a portion of the side view, respectively, of another exemplary embodiment of a plurality of deflectable element socket contacts 112 attached to a removable holding member 117 usable to provide an adapter apparatus such as the adapter apparatus of FIGS. 2A-2C.

As shown in FIGS. 5A-5C, the holding member 115 holds the deflectable element socket contacts 111 at a suitable distance 121 from each other. Such distance 121, for example, may be dependent upon the spacing of corresponding openings into which the socket contacts 111 are to be inserted. The chamfered portions 122 of each socket contact 111 are attached to the holding member 115 along a break line 123 (e.g., a thinner section of material; such as half the thickness of the socket contacts). In such a manner, upon insertion of the plurality of socket contacts 111 into corresponding openings 30 from the pin receiving side 22 of substrate 20 and to a desired position therein, the holding member 115 may be removed by mechanical action along the break line 123 (e.g., snapped off, etc.) leaving the socket contacts 111 within the corresponding openings 30.

As shown in FIGS. 6A-6C, the holding member 117 holds the deflectable element socket contacts 112 at a suitable distance 131 from each other. Such distance 131, for example, may be dependent upon the spacing of corresponding openings 30 into which the socket contacts 112 are to be inserted. The end connection portions 132 of each socket contact 112 are attached to the holding member 117 along a break line 133. In such a manner, upon insertion of the plurality of socket contacts 112 into corresponding openings 30 from the connection side 24 of the substrate 20 and to a desired position therein, the holding member 117 may be removed by mechanical action along the break line 133 (e.g., snapped off, etc.) leaving the socket contacts 112 within the corresponding openings 30.

The adapter apparatus 10 may be assembled as described herein with reference to the other Figures. For example, the adapter apparatus 10 may be assembled to provide the end connection portions 52 at the connection side 24 of the adapter apparatus 10, for example, for connection to one or more pads 14 of a target board 12. Further, for example, the adapter apparatus 10 may be assembled to provide pin receiving regions within the deflectable element socket contacts 40 for mating with male terminal pins, such as male terminal pins 81 of the male adapter apparatus 80.

For example, in one or more embodiments, a substrate 20 may be provided as described herein. For example, substrate 20 may be provided by drilling or laser forming various regions of the openings 30 in the substrate 20. The plurality of the flexible element socket contacts 40 may be inserted into the corresponding openings (e.g., held in place using an interference fit). For example, the holding members described with reference to FIGS. 5-6 may be used for such insertion, or any other suitable insertion technique may be used (e.g., vibrational loading, etc.). Thereafter, a male pin adapter 80 may be positioned in contact between the first and second deflectable elements 54, 56 of the socket contacts 40 to deflect such deflectable elements 54, 56 within the first and second deflection regions 34, 36 from their normal state, respectively, to a deflected state providing effective electrical contact.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the invention, will be apparent to persons skilled in the art upon reference to this description.

The invention claimed is:

1. An adapter apparatus comprising:
   a substrate having a pin receiving side and a connection side opposite the pin receiving side, wherein a plurality of openings are defined through the substrate between the pin receiving side and the connection side, wherein each opening of the plurality of openings comprises:
      a center pin receiving region extending along at least a portion of an axis of the opening, wherein the center pin receiving region is defined by two opposing surfaces located along the axis, wherein the center pin receiving region comprises a cross-section area orthogonal to the axis that is greater than the cross-section area of a male pin receivable therein, and
      first and second deflection regions, wherein each of the first and second deflection regions are defined by one or more deflection region surfaces opposite the other and adjacent the two opposing surfaces located along the axis and defining the center pin receiving region, wherein each of the first and second deflection regions comprises a cross-section area orthogonal to the axis and adjacent the center pin receiving region that is less than the cross-sectional area of the pin receiving region; and
   a plurality of deflectable element socket contacts, wherein each of the plurality of deflectable element socket contacts is provided within a corresponding opening of the plurality of openings, and further wherein each of the plurality of deflectable element socket contacts comprises:
      an end connection portion, and
      first and second deflectable elements, wherein the first deflectable element is coupled to the end connection portion and provided at least partially in the first deflection region with a portion thereof in contact with at least a portion of the one or more deflection region surfaces defining the first deflection region, wherein the second deflectable element is coupled to the end connection portion and provided at least partially in the second deflection region with a portion thereof in contact with at least a portion of the one or more deflection region surfaces defining the second deflection region, wherein the first and second deflectable elements are configured to deflect within the first and second deflection regions, respectively, when the male pin is received in the center pin receiving region and in contact between the first and second deflectable elements, wherein each of the first and second deflectable elements is flat and comprises a thickness that is less than a diameter of the male pin receivable in the center pin receiving region.

2. The adapter apparatus of claim 1, wherein the first and second deflectable elements are symmetrical about the axis extending through the corresponding opening and spaced apart to receive the male pin therebetween.

3. The adapter apparatus of claim 1, wherein the first and second deflectable elements are spaced apart by a greater distance towards the connection side of the substrate than towards the pin receiving side of the substrate.

4. The adapter apparatus of claim 3, wherein the first and second deflectable elements are spaced apart by a distance that is less than the diameter of the male pin to be received thereby towards the pin receiving side of the substrate, and further wherein the plurality of deflectable element socket contacts are press-fit in the respective plurality of openings and/or held in the respective plurality of openings using one or more features.

5. The adapter apparatus of claim 1, wherein each of the first and second deflectable elements comprises an elongate portion, wherein the elongate portion of the first deflectable element extends from a first end region located within the first deflection region and coupled to the end connection portion to a second end region located at least in part within the pin receiving region, and further wherein the elongate portion of the second deflectable element extends from a first end region located within the second deflection region and coupled to the end connection portion to a second end region located at least in part within the pin receiving region.

6. The adapter apparatus of claim 5, wherein each of the elongate portions of the first and second deflectable elements are coupled to the end connection portion by a transition portion, the end connection portion being centered at the connection side of the substrate relative to the pin receiving region.

7. The adapter apparatus of claim 6, wherein the end connection portion extends beyond the connection side of the substrate through a blocking layer used to close the opening at the connection side of the substrate, and further wherein a fill material is provided between the end connection portions of the plurality of deflectable element socket contacts adjacent the connection side of the substrate.

8. The adapter apparatus of claim 5, wherein each of the elongate portions of the first and second deflectable elements are coupled to the connection end by a transition portion, wherein each of the transition portions comprise a contact surface in contact with at least a portion of the one or more deflection region surfaces defining the first and second deflection regions, respectively.

9. The adapter apparatus of claim 8, wherein a length of each of the first and second deflectable elements is at least twice the width of the deflectable element socket contacts from the contact surface on the first deflectable element to the contact surface on the second deflectable element.

10. The adapter apparatus of claim 5, wherein each of the first and second deflectable elements terminates towards the pin receiving side of the substrate at a chamfered region to center the male pin when inserted into the pin receiving region of the opening.

11. The adapter apparatus of claim 1, wherein the center pin receiving region comprises a center cylindrical region having a diameter that is greater than the diameter of the male pin to be received therein, wherein each of the first and second deflection regions comprise a cylindrical region having a diameter that is less than the diameter of the center cylindrical region.

12. A method for use in forming an adapter apparatus, wherein the method comprises:
providing a substrate having a pin receiving side and a connection side opposite the pin receiving side, wherein a plurality of openings are defined through the substrate between the pin receiving side and the connection side, wherein each opening of the plurality of openings comprises:
a center pin receiving region extending along at least a portion of an axis of the opening, wherein the center pin receiving region is defined by two opposing surfaces located along the axis, wherein the center pin receiving region comprises a cross-section area orthogonal to the axis that is greater than the cross-section area of a male pin receivable therein, and
first and second deflection regions, wherein each of the first and second deflection regions are defined by one or more deflection region surfaces opposite the other and adjacent the two opposing surfaces located along the axis and defining the center pin receiving region, wherein each of the first and second deflection regions comprises a cross-section area orthogonal to the axis and adjacent the center pin receiving region that is less than the cross-sectional area of the pin receiving region;
inserting a deflectable element socket contact into each of the plurality of openings, wherein the deflectable element socket contact comprises:
an end connection portion, and
first and second deflectable elements, wherein the first deflectable element is coupled to the end connection portion and provided at least partially in the first deflection region with a portion thereof in contact with at least a portion of the one or more deflection region surfaces defining the first deflection region, wherein the second deflectable element is coupled to the end connection portion and provided at least partially in the second deflection region with a portion thereof in contact with at least a portion of the one or more deflection region surfaces defining the second deflection region, wherein each of the first and second deflectable elements is flat and comprises a thickness that is less than a diameter of the male pin receivable in the center pin receiving region; and
positioning a conductive male pin in contact between the first and second deflectable elements causing at least a portion of the first and second deflectable elements to deflect within the first and second deflection regions, respectively.

13. The method of claim 12, wherein the first and second deflectable elements are symmetrical about an axis extending through the corresponding opening and spaced apart to receive the male pin therebetween, and further wherein the plurality of deflectable element socket contacts are press-fit in the respective plurality of openings and/or held in the respective plurality of openings using one or more features.

14. The method of claim 12, wherein the first and second deflectable elements are spaced apart by a greater distance towards the connection side of the substrate than towards the pin receiving side of the substrate.

15. The method of claim 14, wherein the first and second deflectable elements are spaced apart by a distance that is less than the diameter of the male pin to be received thereby towards the pin receiving side of the substrate.

16. The method of claim 12, wherein each of the first and second deflectable elements comprises an elongate portion, wherein the elongate portion of the first deflectable element extends from a first end region located within the first deflection region and coupled to the end connection portion to a second end region located at least in part within the pin receiving region, wherein the elongate portion of the second deflectable element extends from a first end region located within the second deflection region and coupled to the end connection portion to a second end region located at least in part within the pin receiving region, and further wherein each of the elongate portions of the first and second deflectable elements are coupled to the end connection portion by a transition portion, the end connection portion being centered at the connection side of the substrate relative to the pin receiving region.

17. The method of claim 16, wherein the end connection portions of the plurality of deflectable element socket contacts extend beyond the connection side of the substrate through a blocking layer used to close the openings, and wherein the method further comprises:
providing a fill formation surface over ends terminating the end connection portions of the plurality of deflectable element socket contacts;
providing fill material between the fill formation surface and the connection side of the substrate; and
removing the fill formation surface exposing the ends terminating the end connection portions of the plurality of deflectable element socket contacts.

18. The method of claim 12, wherein the method further comprises providing a plurality of deflectable element socket contacts along a removable holding member, and further wherein inserting a deflectable element socket contact into each of the plurality of openings comprises:
inserting one or more of the plurality of deflectable element socket contacts along the removable holding member into a plurality of corresponding openings; and
removing the holding member from the deflectable element socket contacts inserted in corresponding openings.

19. The adapter apparatus of claim 1, wherein the plurality of openings defined through the substrate between the pin receiving side and the connection side are arranged in an array of columns and rows defined by x and y axes orthogonal to the axis of each opening of the plurality of openings, wherein the center pin receiving region and the first and second deflection regions of each opening of the plurality of openings define an elongated cross-sectional opening orthogonal to the axis thereof having a length that is greater than a width thereof, and further wherein the elongated cross-sectional openings are arranged with the lengths thereof extending diagonally relative to the x and y axes.

20. The method of claim 12, wherein the plurality of openings defined through the substrate between the pin receiving side and the connection side are arranged in an array of columns and rows defined by x and y axes orthogonal to the axis of each opening of the plurality of openings, wherein the center pin receiving region and the first and second deflection regions of each opening of the plurality of openings define an elongated cross-sectional opening orthogonal to the axis thereof having a length that is greater than a width thereof, and further wherein the elongated cross-sectional openings are arranged with the lengths thereof extending diagonally relative to the x and y axes.

* * * * *